United States Patent [19]
Jang

[11] Patent Number: 5,483,187
[45] Date of Patent: Jan. 9, 1996

[54] POWER-ON RESET CIRCUIT

[75] Inventor: Hyun S. Jang, Bubaleub, Rep. of Korea

[73] Assignee: Hyundai Electronics Industries Co., Ltd., Rep. of Korea

[21] Appl. No.: 213,154

[22] Filed: Mar. 15, 1994

[30] Foreign Application Priority Data

Mar. 15, 1993 [KR] Rep. of Korea .................... 1993-3785

[51] Int. Cl.$^6$ ............................................. H03K 17/284
[52] U.S. Cl. ........................................ 327/143; 327/198
[58] Field of Search .................................. 327/142, 143, 327/205, 198, 142, 143

[56] References Cited

U.S. PATENT DOCUMENTS

| | | | |
|---|---|---|---|
| 4,419,596 | 12/1983 | Kikuchi | 327/143 |
| 4,716,322 | 12/1987 | D'Arrigo et al. | 327/143 |
| 5,148,051 | 9/1992 | Deierling et al. | 327/143 |
| 5,323,066 | 6/1994 | Feddeler et al. | 327/142 |

Primary Examiner—Timothy P. Callahan
Assistant Examiner—Terry L. Englund
Attorney, Agent, or Firm—Merchant, Gould, Smith, Edell, Welter & Schmidt

[57] ABSTRACT

A power-on reset circuit is disclosed comprising a capacitor for being charged to a desired voltage and then being discharged; a Schmitt trigger circuit for discriminating the voltage discharged from the capacitor and transitioning instantaneously its output when the discharged voltage reaches a predetermined level to output a reset signal, and then transitioning its output again after the lapse of a predetermined time period to maintain a constant voltage; a state latch circuit for inputting the output of the Schmitt trigger circuit, the state latch circuit being transitioned after the lapse of a predetermined time period from generation of the reset signal by the Schmitt trigger circuit and then remaining at the transitioned state; and an inverter for inverting an output voltage of the state latch circuit and applying the inverted output voltage to the capacitor. In accordance with the invention, the power-on reset circuit generates a reset pulse regardless of a voltage rise time, consumes little or no appreciable power after generation of the reset pulse, occupies a small space due to its efficient construction, and has a readily adjustable reset time.

7 Claims, 2 Drawing Sheets

5,483,187

POWER-ON RESET CIRCUIT

FIELD OF THE INVENTION

The present invention relates to a power-on reset circuit employing a state latch.

BACKGROUND OF THE INVENTION

Generally, a power-on reset circuit generates a reset pulse upon power on to allow certain logic to enter a predetermined state. Because the power-on reset circuit is typically operated without use of an external power supply pin, it is mostly employed in integrated circuits.

Various considerations must be accounted for when implementing a power-on reset circuit. First, the rise time of a voltage $V_{DD}$ being charged in the integrated circuit after power-on is varied according to the size and characteristics of the integrated circuit. The power-on reset circuit must generate a reset clock pulse upon power-up to reset the logic in the integrated circuit regardless of the rise time of the voltage $V_{DD}$, so as to allow the logic to enter an operable state.

Second, the power-on reset circuit must consume little or no power when in a stable state after generation of a reset signal. Third, the power-on reset circuit must occupy very little space within the integrated circuit.

However, in a conventional power-on reset circuit, the reset operation is generally performed by delaying a reset state prior to power-on, typically using a time delay device comprising a resistor and a capacitor. This results in the release of the reset state before power-up of the integrated circuit in cases where the voltage $V_{DD}$ rise time is long. Also, a conventional power-on reset circuit generally continues to consume an appreciable amount of power after generation of the reset signal and occupies a considerable amount of space within the integrated circuit, resulting in reduced levels of integration and integration flexibility.

SUMMARY OF THE INVENTION

Therefore, the present invention overcomes these and other problems, and it is an object of the present invention to provide a power-on reset circuit which generates a reset pulse regardless of a voltage rise time, consumes little or no appreciable power after generation of the reset pulse, occupies a small space due to its efficient construction, and has a readily adjustable reset time.

In accordance with the present invention, the above and other objects can be accomplished by providing a power-on reset circuit comprising capacitance means for being charged to a desired voltage and then discharged; Schmitt triggering means for discriminating the voltage discharged from the capacitance means, transitioning instantaneously its output, when the discharged voltage reaches a predetermined level, to output a reset signal, and then transitioning its output again after the lapse of a predetermined time period to maintain a constant voltage thereafter; state latch means for receiving the output of the Schmitt triggering means, the state latch means being transitioned after the lapse of a predetermined time period from generating the reset signal by the Schmitt triggering means and then remaining at the transitioned state; and inverting means for inverting an output voltage of the state latch means and applying the inverted voltage to the capacitance means.

BRIEF DESCRIPTION OF THE DRAWINGS

The above and other objects, features, and advantages of the present invention will be more clearly understood from the following detailed description taken in conjunction with the accompanying drawings, in which.

DETAILED DESCRIPTION OF THE PREFERRED EMBODIMENT

Figure 1:
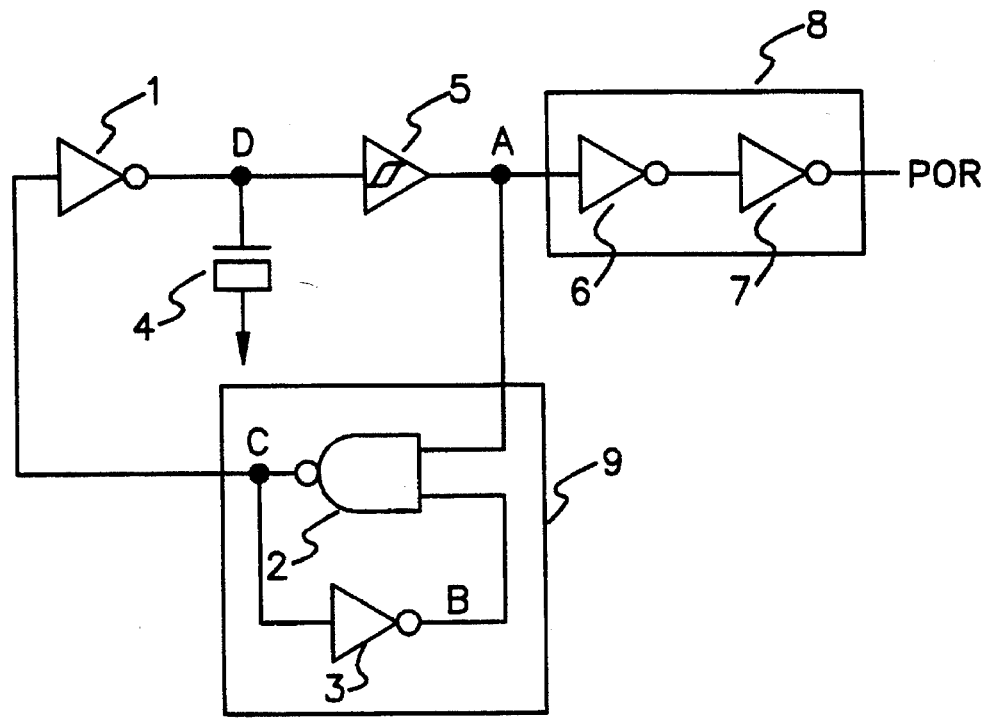
FIG. 1 is a circuit diagram of a power-on reset circuit in accordance with the present invention.

Referring to FIG. 1, there is shown a circuit diagram of a power-on reset circuit in accordance with the present invention. As shown in this drawing, the power-on reset circuit comprises a capacitor 4, a Schmitt trigger circuit 5, an inverter 1, a state latch circuit 9, and a buffer 8. The state latch circuit 9 includes a NAND gate 2 and an inverter 3. The buffer 8 includes two inverters 6 and 7 connected in series.

The inverter 1, the Schmitt trigger circuit 5, and the state latch circuit 9 constitute a loop. Namely, an output terminal of the Schmitt trigger circuit 5 is connected to an input terminal of the state latch circuit 9, an output terminal of which is connected to an input terminal of the inverter 1. Also, an output terminal of the inverter 1 is connected to an input terminal of the Schmitt trigger circuit 5. The capacitor 4, for providing a time delay, is connected between the output terminal of the inverter 1 and the input terminal of the Schmitt trigger circuit 5. The buffer 8 is connected to the output terminal of the Schmitt trigger circuit 5 to output a reset pulse to a processor POR (not shown).

In the state latch circuit 9, the NAND gate 2 has one input terminal connected between the Schmitt trigger circuit 5 and the buffer 8 and the other input terminal connected to an output terminal of the inverter 3. The inverter 3 has an input terminal connected to an output terminal of the NAND gate 2.

Figure 2:
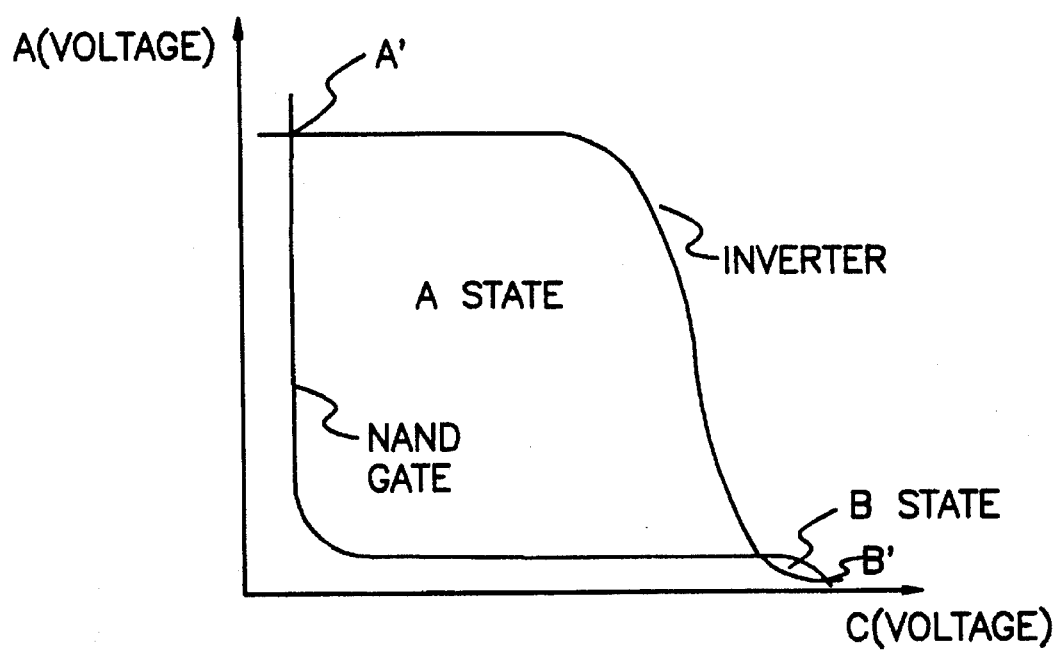
FIG. 2 is a view illustrating a bistable latch state of the power-on reset circuit in FIG. 1 in accordance with the present invention.
Figure 3:
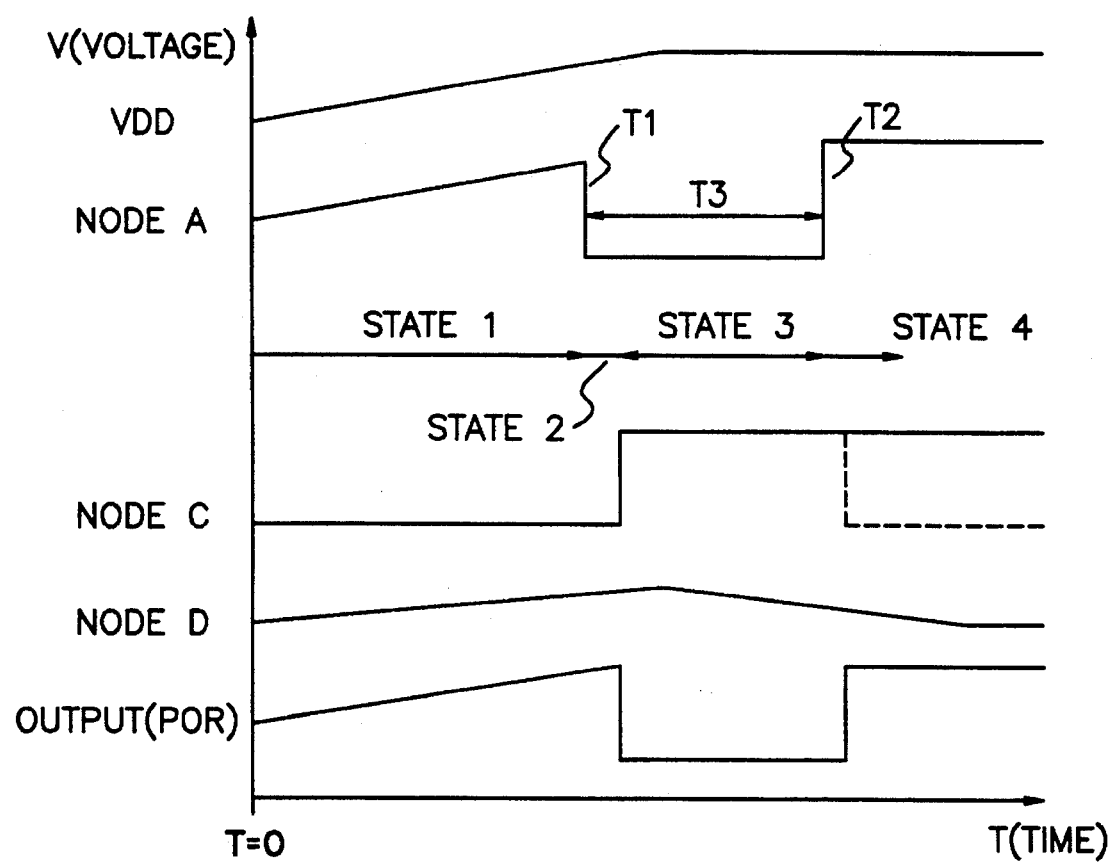
FIG. 3 is a timing diagram of voltages associated with components in the power-on reset circuit of FIG. 1 in accordance with the present invention.

The operation of the power-on reset circuit with the above-mentioned construction in accordance with the present invention will hereinafter be described in detail with reference to FIGS. 2 and 3. FIG. 2 is a view illustrating a bistable latch state of the power-on reset circuit shown in FIG. 1 in accordance with the present invention, and FIG. 3 is a timing diagram of voltages associated with the components in the power-on reset circuit illustrated in FIG. 1 in accordance with the present invention.

When a supply voltage is applied to the power-on reset circuit and then reaches a level capable of operating the reset circuit, an initial voltage of the capacitor 4, connected to a node D, is low and an initial voltage at an output node A of the Schmitt trigger circuit 5 is high. Also, an initial voltage at an output node B of the inverter 3 is high. An initial voltage at an output node C of the NAND gate 2 is low because both of the initial voltages respectively at the output nodes A and B of the Schmitt trigger circuit 5 and the inverter 3 are high.

At this time, the state latch circuit 9 consisting of the NAND gate 2 and the inverter 3 reaches a stable point A' since it has a state A, as shown in FIG. 2. State curves in FIG. 2 are determined according to a current gain β of a transistor (not shown) in the state latch circuit 9. As the supply voltage rises in the power-on reset circuit, the voltages at the nodes A and B are made high, thereby causing the voltage at the output node C of the NAND gate 2 to go low. The low voltage at the node C allows the node D and the capacitor 4 to be gradually charged by the inverter 1. At the moment that the increasing voltage of the node D reaches a point T1 as shown in FIG. 3, the output node A of the Schmitt trigger circuit 5, performing a bistable multivibrating operation, instantaneously goes low and the output node C of the NAND gate 2 goes high.

Because the output node C of the NAND gate 2 is high, the output node D of the inverter 1 becomes low, resulting in discharging of the capacitor 4. At the moment that the voltage at the node D reaches a point T2 as shown in FIG. 3, the Schmitt trigger circuit 5 is triggered into a high level state and the nodes C and B are latched into high and low level states, respectively. Because the node C is latched into the high level state, no increase in voltage at node D and at the input of the capacitor 4 occurs, the node A remains at its high level state as shown by state 4 in FIG. 3, and the state latch circuit 9 reaches a stable point B' as shown in FIG. 2. As a result, the state latch circuit 9 is latched into a state B as shown in FIG. 2.

A reset time T3 between the moments T1 and T2 is adjusted by adjusting the size of the inverter 1. Namely, the reset time T3 can be lengthened by making the current supply capability of the inverter 1 smaller. The reset signal is outputted to the processor POR by the buffer 8 provided with the inverters 6 and 7, which are connected in series to the output node A of the Schmitt trigger circuit 5.

In an embodiment where the state latch circuit 9 does not have the inverter 3, for example, the node C is oscillated with a waveform as shown by the dotted line in FIG. 3. In the case where the state latch circuit 9 has the inverter 3 as described in the preferred embodiment of the present invention, the node C remains at state 4 via states 1, 2 and 3 with no power being consumed by the novel power-on reset circuit.

It has been made apparent from the above description that the power-on reset circuit of the present invention generates the reset signal regardless of a voltage rise time. Also, the power-on reset circuit consumes no power because it performs the state latch operation after generation of the reset signal. Further, the power-on reset circuit occupies a relatively small space due to its efficient construction. Therefore, the present invention can be applied to a high density integrated circuit.

Although the preferred embodiments of the present invention have been disclosed for illustrative purposes, those skilled in the art will appreciate that various modifications, additions, and substitutions are possible, without departing from the scope and spirit of the invention as disclosed in the accompanying claims.

What is claimed is:

1. A power-on reset circuit comprising:

capacitance means for being charged to a desired voltage and being discharged;

Schmitt triggering means for discriminating the voltage discharged from the capacitance means, the Schmitt triggering means transitioning its output to a first state to produce a reset signal when the discharged voltage reaches a predetermined level, and then transitioning its output to a second state after the lapse of a first predetermined time period;

state latch means for receiving the output of the Schmitt triggering means, the state latch means being transitioned by the output of the Schmitt triggering means after the lapse of a second predetermined time period from generation of the reset signal, and then remaining at the transitioned state;

inverting means for inverting an output voltage of the state latch means and applying the inverted output voltage to the capacitance means; and buffering means for buffering the output of the Schmitt triggering means.

2. A power-on reset circuit comprising:

capacitance means for being charged to a desired voltage and then being discharged;

Schmitt triggering means for discriminating the voltage discharged from the capacitance means, the Schmitt triggering means transitioning instantaneously its output to first state when the discharged voltage reaches a predetermined level to output a reset signal, and then transitioning its output to second state again after the lapse of a predetermined time period to maintain a constant voltage;

state latch means for receiving the output of the Schmitt triggering means, the state latch means including a NAND gate having one input terminal connected to an output terminal of the Schmitt triggering means, and an inverter having an input terminal connected to an output terminal of the NAND gate and an output terminal connected to another input terminal of the NAND gate, the state latch means being transitioned by the output of the Schmitt triggering means after the lapse of a predetermined time period from generation of the reset signal, and then remaining at the transitioned state; and inverting means for inverting an output voltage of the state latch means and applying the inverted output voltage to the capacitance means.

3. A power-on reset circuit as set forth in claim 2, further comprising buffering means for buffering the output of the Schmitt triggering means.

4. A power-on reset circuit comprising:

a capacitor for being charged to a predetermined voltage and being discharged;

a Schmitt trigger for discriminating the voltage discharged from the capacitor, the Schmitt trigger transitioning its output to a first state to produce a reset signal when the discharged voltage reaches a predetermined level, and the Schmitt trigger transitioning its output to a second state after the lapse of a first predetermined time period;

state latch means for receiving the output of the Schmitt trigger, the state latch means transitioning its state to a latched state in response to the output of the Schmitt trigger after the lapse of a second predetermined time period from generation of the reset signal; and inverting means for inverting an output voltage of the state latch means and applying the inverted output voltage to the capacitor.

5. A power-on reset circuit as set forth in claim 4, further comprising buffering means for buffering the output of the Schmitt trigger.

6. A power-on reset circuit as set forth in claim 4, wherein the state latch means includes:

a NAND gate having an input terminal coupled to an output terminal of the Schmitt trigger; and an inverter having an input terminal coupled to an output terminal of the NAND gate and an output terminal coupled to another input terminal of the NAND gate.

7. A power-on reset circuit as set forth in claim 4, wherein the first predetermined time period associated with the Schmitt trigger transitioning its output from the first state to the second state is adjustable.

* * * * *